United States Patent
We et al.

(10) Patent No.: US 9,269,610 B2
(45) Date of Patent: Feb. 23, 2016

(54) PATTERN BETWEEN PATTERN FOR LOW PROFILE SUBSTRATE

(71) Applicant: QUALCOMM Incorporated, San Diego, CA (US)

(72) Inventors: Hong Bok We, San Diego, CA (US); Chin-Kwan Kim, San Diego, CA (US); Dong Wook Kim, San Diego, CA (US); Jae Sik Lee, San Diego, CA (US); Kyu-Pyung Hwang, San Diego, CA (US); Young Kyu Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/253,798

(22) Filed: Apr. 15, 2014

(65) Prior Publication Data
US 2015/0294933 A1    Oct. 15, 2015

(51) Int. Cl.
*H01L 21/44* (2006.01)
*H01L 21/768* (2006.01)
(Continued)

(52) U.S. Cl.
CPC .......... *H01L 21/768* (2013.01); *H01L 21/4857* (2013.01); *H01L 21/76879* (2013.01); *H01L 21/76885* (2013.01); *H01L 23/49822* (2013.01); *H01L 23/5283* (2013.01); *H01L 23/5329* (2013.01); *H01L 2224/131* (2013.01); *H01L 2224/13147* (2013.01); *H01L 2224/16225* (2013.01); *H01L 2924/14* (2013.01); *H01L 2924/15311* (2013.01)

(58) Field of Classification Search
CPC ............ H01L 21/0228; H01L 21/4825; H01L 21/28556; H01L 21/02332; H01L 21/28079; H01L 21/02642; H01L 21/67069; H01L 21/2894; H01L 21/02271; H01L 21/28194; H01L 21/0231; H01L 23/3114; H01L 23/488; H01L 23/4952; H01L 21/027; H01L 21/266
USPC ......... 438/680, 311, 113, 106, 474, 363, 463, 438/612, 613, 687, 725, 769, 792, 745; 257/347, 499, 678, E21.006, E21.027, 257/E21.134, E21.17, E21.259, E21.267, 257/E21.321, E21.329, E21.229, E21.499, 257/E21.508, E21.511
See application file for complete search history.

(56) References Cited

U.S. PATENT DOCUMENTS 5,136,358 A    8/1992  Sakai et al.
6,414,367 B1   7/2002  Hopper
(Continued)

FOREIGN PATENT DOCUMENTS

GB    2252668 A     8/1992
JP    2002299555 A  10/2002
(Continued)

OTHER PUBLICATIONS

International Search Report and Written Opinion—PCT/US2015/025435—ISA/EPO—Jul. 27, 2015.

*Primary Examiner* — David Nhu
(74) *Attorney, Agent, or Firm* — Muncy, Geissler, Olds & Lowe, P.C.

(57) ABSTRACT

An integrated circuit (IC) substrate that includes a second patterned metal layer formed in between a first patterned metal layer is disclosed. A dielectric layer formed on the first patterned metal layer separates the two metal layers. A non-conductive layer is formed on the dielectric layer and the second patterned metal layer.

30 Claims, 12 Drawing Sheets

(51) Int. Cl.
*H01L 23/498* (2006.01)
*H01L 21/48* (2006.01)
*H01L 23/528* (2006.01)
*H01L 23/532* (2006.01)

(56) References Cited

U.S. PATENT DOCUMENTS

| | | | |
|---|---|---|---|
| 8,377,792 B2 * | 2/2013 | Hopper et al. | 438/399 |
| 8,551,856 B2 * | 10/2013 | Rennie et al. | 438/396 |
| 8,722,505 B2 * | 5/2014 | Hopper et al. | 438/396 |
| 9,012,966 B2 * | 4/2015 | Chidambaram et al. | 257/296 |
| 2005/0205918 A1 | 9/2005 | Abiko | |
| 2011/0215465 A1 * | 9/2011 | Rahman et al. | 257/737 |
| 2012/0097319 A1 | 4/2012 | Maeda | |

FOREIGN PATENT DOCUMENTS

| | | |
|---|---|---|
| JP | 2007194476 A | 8/2007 |
| KR | 20030089568 A | 11/2003 |

* cited by examiner

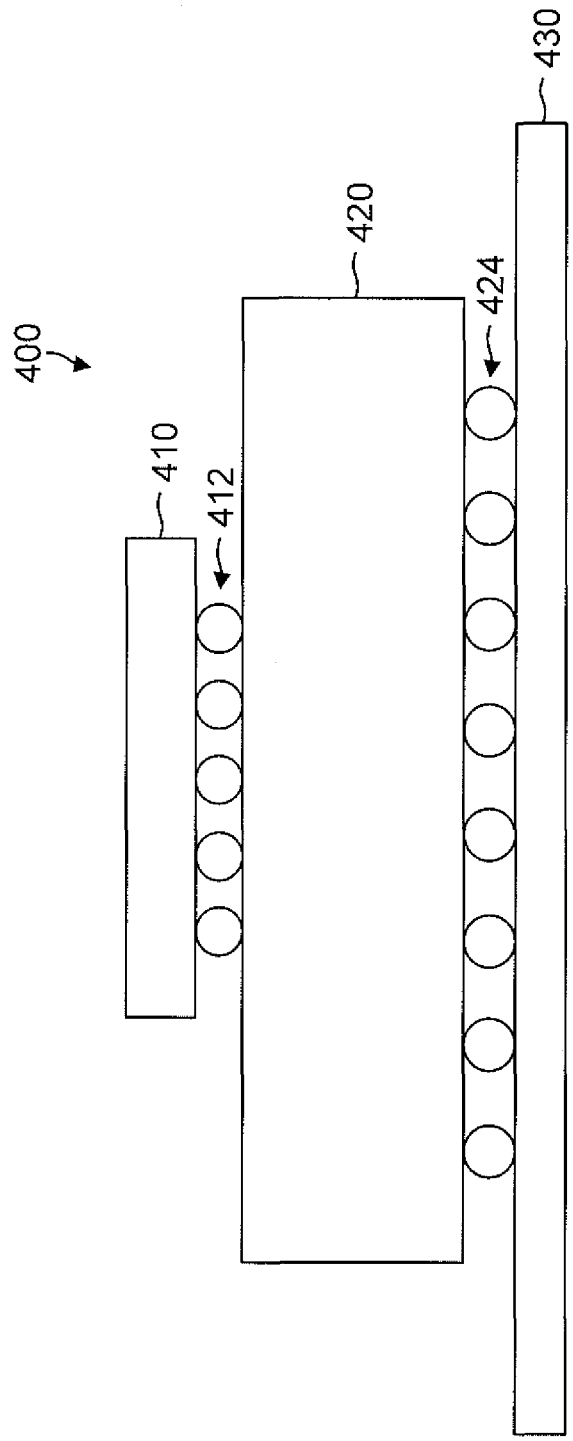

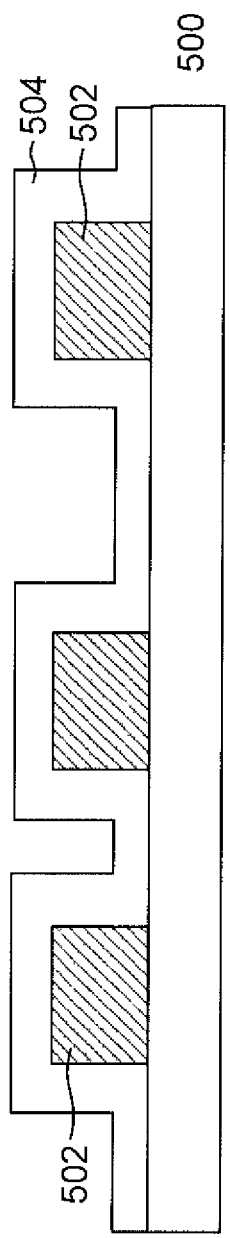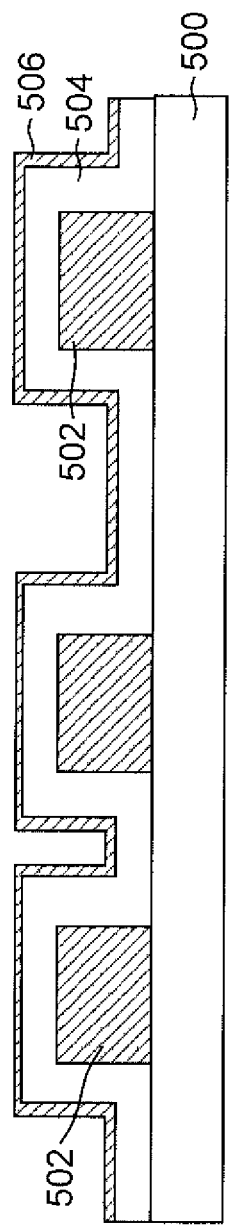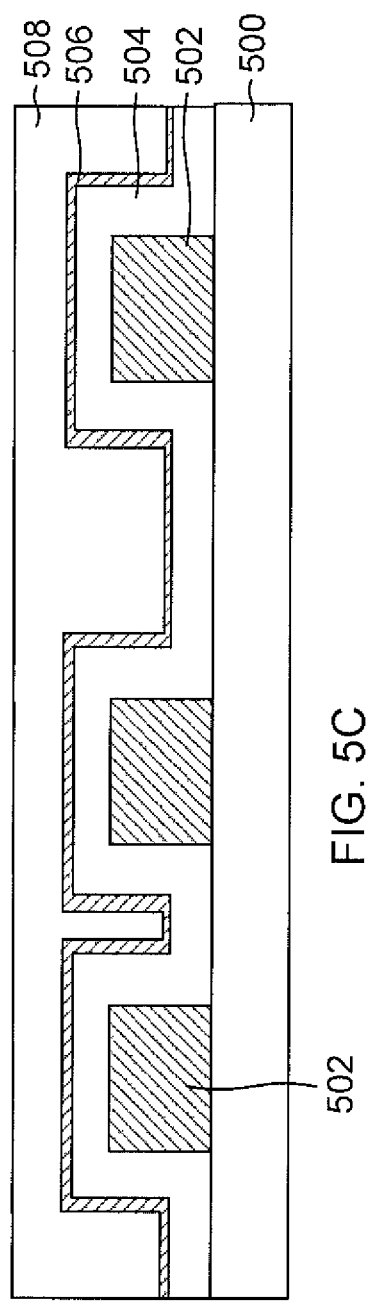

PATTERN BETWEEN PATTERN FOR LOW PROFILE SUBSTRATE

TECHNICAL FIELD

This application relates to substrates in integrated circuit devices, and more particularly, to substrates that include a metal pattern in between a metal pattern to provide a low profile substrate.

BACKGROUND

To manufacture integrated circuit (IC) devices, photolithography is typically used. Photolithography produces a three-dimensional pattern on a surface of a substrate using a light-sensitive photoresist material and controlled exposure to light. Generally, the resist is applied on the substrate surface as a polymer solution. The resist is then baked, which drives out the solvent. Next, the resist is exposed to controlled light. The light passes through a mask that defines the desired pattern. The pattern is transferred to the resist, and the resist is used to transfer the pattern to the underlying substrate. In this way, layers can be built one on top of another to form the desired IC device.

Patterned conductive material on one level is typically electrically insulated from patterned conductive material on another level by a layer of dielectric material. FIG. 1 illustrates an IC substrate 100 having a first patterned metal layer 104 and a second patterned metal layer 108 according to the prior art. The first patterned metal layer 104 is formed on a substrate 102. A dielectric layer 106 is formed over the first patterned metal layer 104 and separates the second patterned metal layer 108 from the first patterned metal layer 104. The second patterned metal layer 108 is formed on the dielectric material 106. The space 110 between the two patterned metal layers is occupied only by dielectric material 106, taking up space and adding unwanted thickness to the IC substrate 100.

FIGS. 2A-2J illustrate a method that is typically used to form patterned metal layers on a substrate. In FIG. 2A, a substrate 200 with a first metal layer 202 formed on the substrate 200 is provided. In FIG. 2B, a photoresist layer 204 is formed on top of the first metal layer 202, and in FIG. 2C, the photoresist layer 204 is patterned to include various openings that expose portions of the first metal layer 202 to subsequent etch. In FIG. 2D, the first metal layer 202 is patterned using the photoresist layer 204. In FIG. 2E, the photoresist layer 204 is removed, leaving the first patterned metal layer 202. In FIG. 2F, a dielectric layer 206 is formed over the first patterned metal layer 202. In FIG. 2G, a photoresist layer 208 is formed on top of the dielectric layer 206. In FIG. 2H, the photoresist layer 208 is patterned and etched to expose portions of the dielectric layer 206. In FIG. 2I, a second metal 210 is deposited on the exposed portions of the dielectric layer 206, and in FIG. 2J, the photoresist layer 208 is removed, leaving the second patterned metal layer 210 and the first patterned metal layer 202, with the dielectric layer 206 separating the two metal layers.

Advances in semiconductor IC design, processing, and packaging technologies have resulted in increases in the number and density of features in a substrate. Nonetheless, the size of portable electronic systems such as portable computers, cell phones, PDAs, etc. continues to shrink despite the addition of new features and functions. New features and functionalities, such as digital cameras and camcorders, global positioning systems, and removable memory cards are continually being integrated into modern portable and/or high density electronic systems. It is therefore desirable to decrease the thickness of the components within portable electronic systems to provide size reduction as well as additional space to add new components.

Accordingly, there is a need in the art for thin, low profile substrates.

SUMMARY

To provide an IC substrate with a reduced thickness and height, an IC substrate that includes a second patterned metal layer formed in between a first patterned metal layer is disclosed. In other words, portions of the second patterned metal layer are located in the middle of portions of the first patterned metal layer. A dielectric layer separates the first patterned metal layer from the second patterned metal layer. A non-conductive layer is formed on the dielectric layer and the second patterned metal layer. In exemplary embodiments, the metal layers comprise copper. In one embodiment, the IC substrate comprises a package substrate such as an organic substrate. Alternatively, the IC substrate may comprise a semiconductor substrate (a die). The IC substrate of the present disclosure not only has a reduced height, but also has improved routing density, greater mechanical stability, and improved electrical performance.

In various embodiments, the dielectric layer is thinner than in traditional implementations and allows the second patterned metal layer to be closer to the first patterned metal layer. In some embodiments, the dielectric layer is uniform in thickness. In an exemplary embodiment, the dielectric layer is about 10 µm thick. In another embodiment, the dielectric layer conforms to the shape of the first patterned metal layer. Vacuum coating may be used to form the dielectric layer.

BRIEF DESCRIPTION OF THE DRAWINGS

FIG. 4 is an integrated circuit package that includes an IC substrate with a pattern in between a pattern in accordance with an embodiment of the present disclosure.

FIGS. 5A-5H are cross-sectional views of a sequence for manufacturing an IC substrate with a pattern in between a pattern in accordance with an embodiment of the present disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

To meet the need in the art for an IC substrate with reduced thickness and height, an IC substrate is provided that includes a second patterned metal layer formed in between a first patterned metal layer. A dielectric layer separates the first patterned metal layer from the second patterned metal layer. The dielectric layer is a means for separating and electrically isolating the first patterned metal layer from the second patterned metal layer. A non-conductive layer is formed on the dielectric layer and the second patterned metal layer. In one embodiment, the IC substrate comprises a package substrate such as an organic substrate. Alternatively, the IC substrate may comprise a die substrate.

Overview

Figure 1:
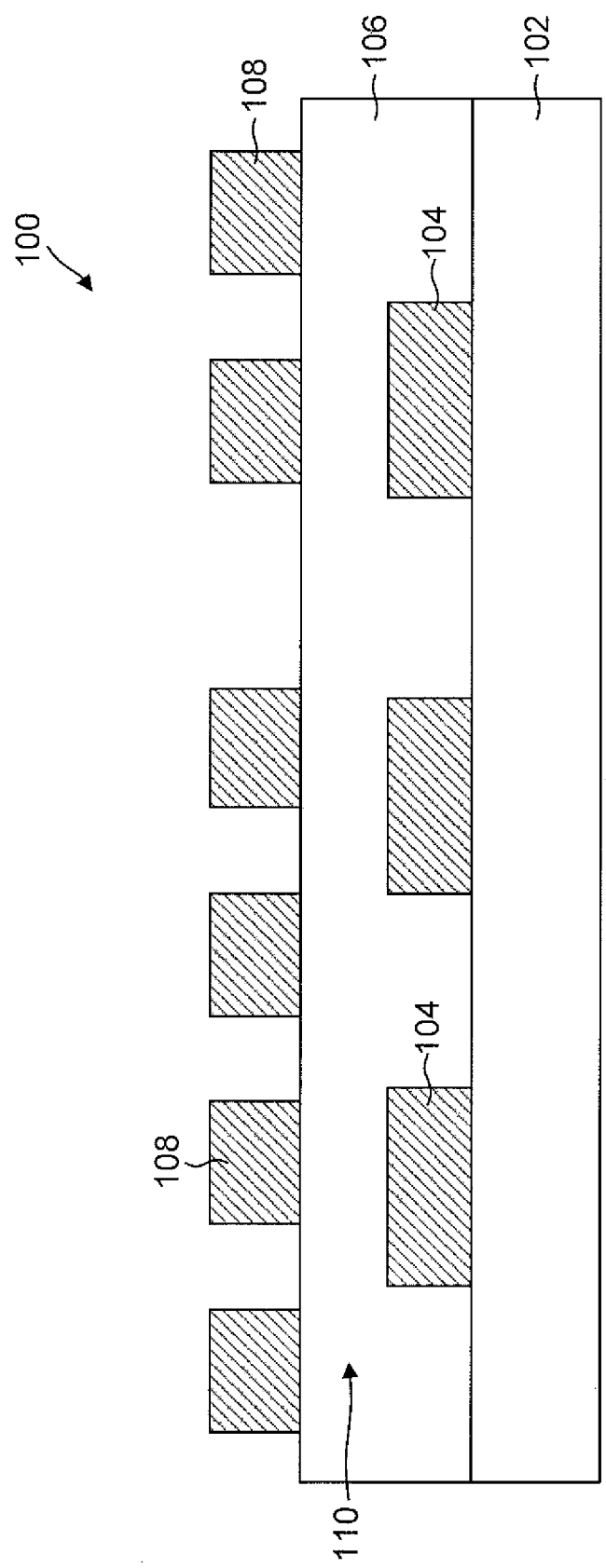
FIG. 1 is a cross-sectional view of an IC substrate with first and second patterned metal layers in accordance with the prior art.
Figure 2A:
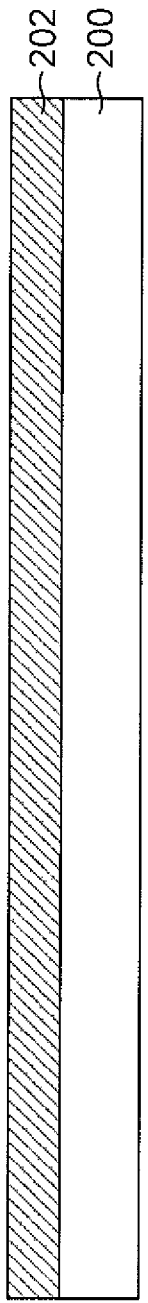
FIGS. 2A-2J are cross-sectional views of an IC substrate at various fabrication stages in accordance with the prior art.
Figure 2B:
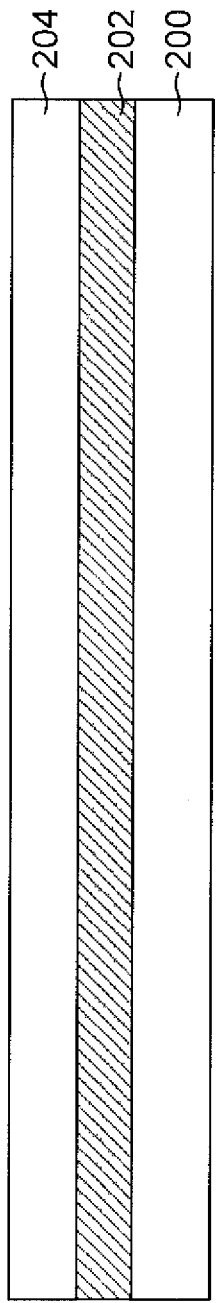
Figure 2C:
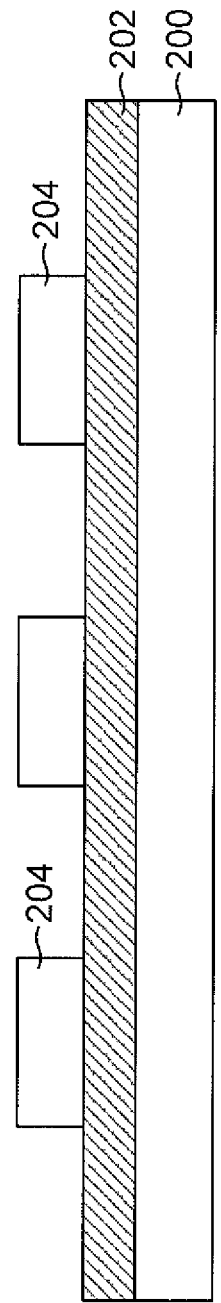
Figure 2D:
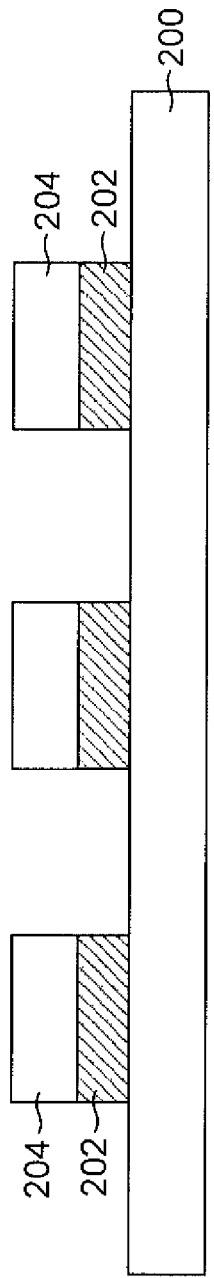
Figure 2E:
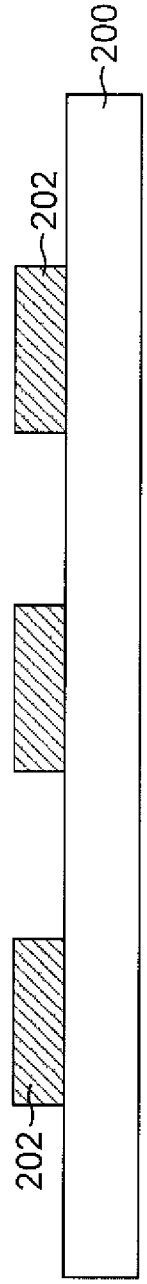
Figure 2F:
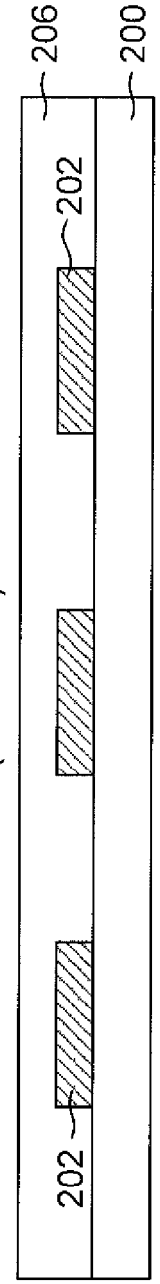
Figure 2G:
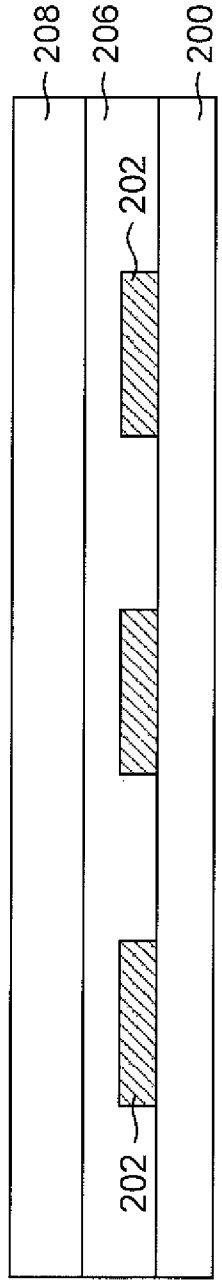
Figure 2H:
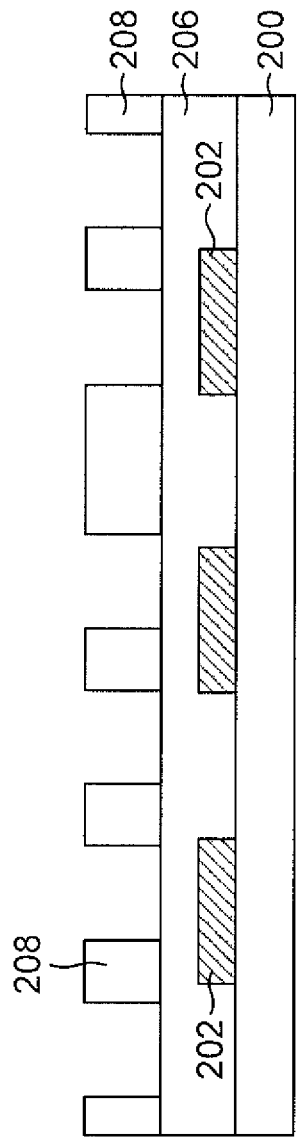
Figure 2I:
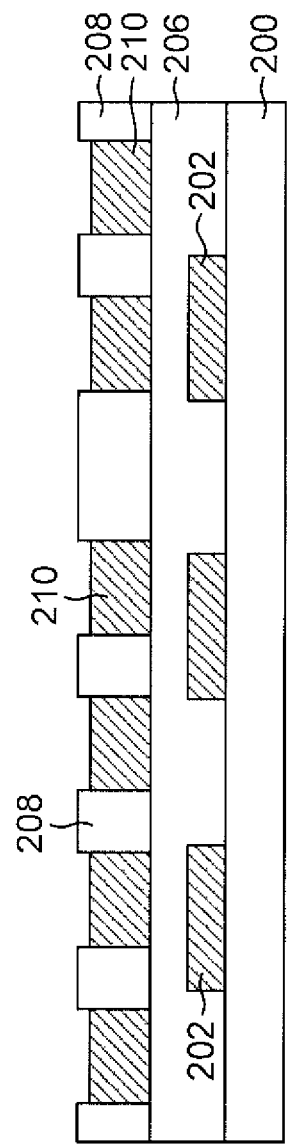
Figure 2J:
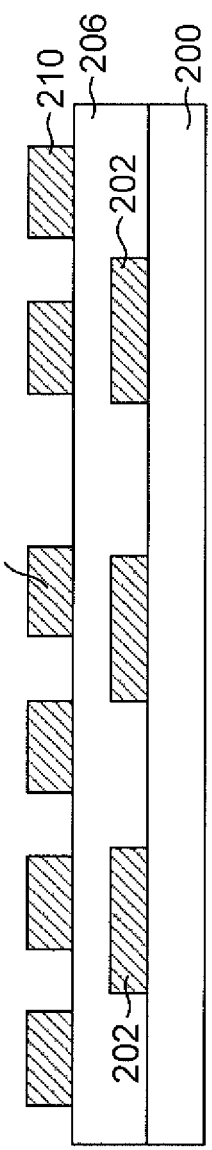
Figure 3A:
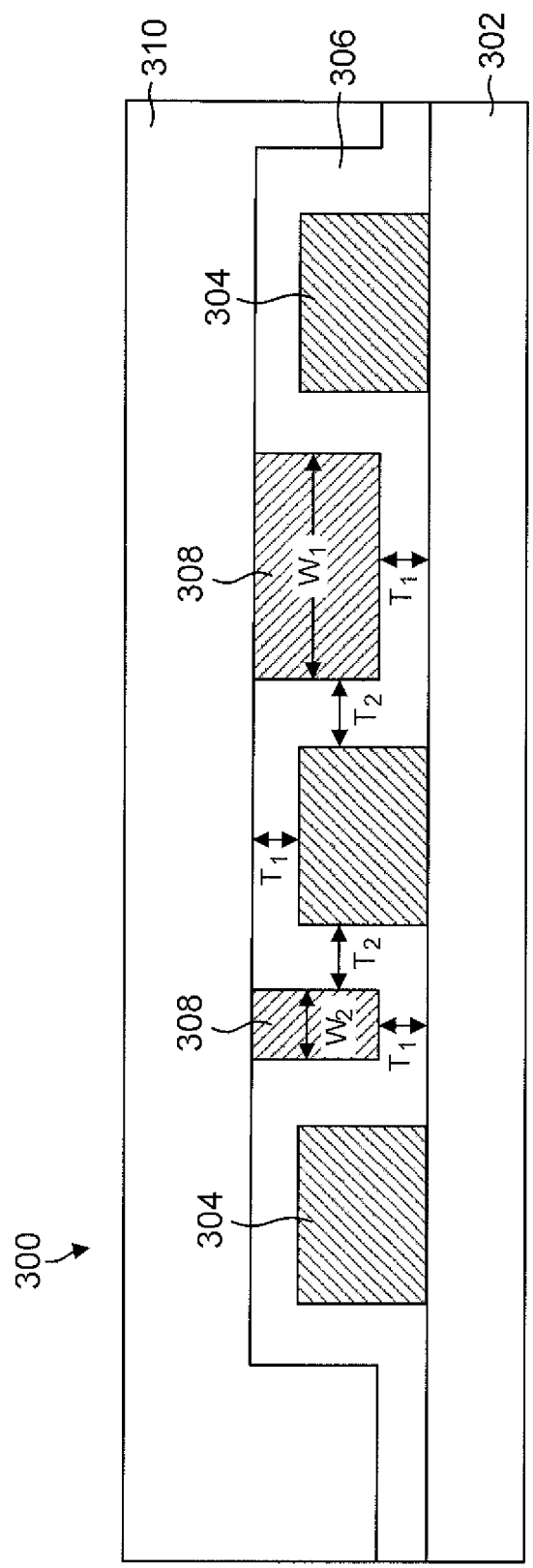
FIG. 3A is a cross-sectional view of an IC substrate with a pattern in between a pattern in accordance with an embodiment of the present disclosure.

FIG. 3A shows an example IC substrate 300 comprising a substrate 302, a first patterned metal layer 304, a dielectric layer 306, a second patterned metal layer 308, and a non-conductive layer 310. The metal layers 304, 308 may comprise copper, nickel, or other suitable metals for conducting such as silver or gold. The dielectric layer 306 covers and conforms to the shape of the first patterned metal layer 306. The dielectric layer 306 typically includes an oxide (e.g., silicon oxide), or any other suitable material such as phosphosilicate glass (PSG) or borophosphosilicate glass (BPSG). The second patterned metal layer 308 is formed on the dielectric layer 306, extends past the first patterned metal layer 304, and is substantially parallel to the first patterned metal layer 304. The second patterned metal layer 308 is formed in between the first patterned metal layer 304. The non-conductive layer 310 is formed on the second patterned metal layer 308 and the dielectric layer 306. In various embodiments, the non-conductive layer 310 comprises a dielectric material, a prepreg material (e.g., epoxy), an organic material, or a combination thereof.

The substrate 302 may include a package substrate or a die substrate. The substrate 302 may comprise a wide variety of forms such as an organic substrate or a semiconductor substrate. One can readily appreciate that the present disclosure is independent of the type of substrate.

When the substrate 230 includes a package substrate, the substrate 302 includes conductive layers (e.g., first and second patterned metal layers 304, 308) to carry power, ground, and signals through the substrate 302. In an embodiment, the conductive layers are formed from copper, although other conductive materials such as tin, lead, nickel, gold, palladium, or other materials may be used. Non-conductive material in the substrate 302 may be formed from organic materials, such as epoxy material.

When the substrate 302 comprises a die substrate, the substrate 302 may include suitable semiconductor materials such as silicon, germanium, silicon carbide, gallium arsenic, indium arsenide, and indium phosphide. The substrate 302 may include a variety of other features such as p-type doped regions and/or n-type doped regions, isolation features, gate stacks, inter-level dielectric (ILD) layers, and conductive features (e.g., first and second patterned metal layers 304, 308).

Referring back to FIG. 3A, in contrast to traditional implementations, the space typically occupied by only dielectric material is now used and includes a second patterned metal layer 308. This space can be used because the dielectric layer 306 is coated onto the first patterned metal layer 304 to conform to the shape of the first patterned metal layer 304. In the past, the dielectric layer was blanket deposited to cover the first patterned metal layer to form a thick dielectric block, regardless of the shape of the first patterned metal layer.

The dielectric layer 306 formed over the first patterned metal layer 304 is thinner than in traditional implementations and allows the second patterned metal layer 308 to be closer to the first patterned metal layer 304. Hence, the second patterned metal layer 308 can be formed in between the first patterned metal layer 304. In an exemplary embodiment, the dielectric layer 306 is about 10 μm thick. The thinner dielectric layer 306 and metal layers 304, 308 that are spaced closer together provide an IC substrate with a reduced thickness/height. Despite the use of a thinner dielectric layer 306, the dielectric layer 306 can still serve as a guard rail that reduces coupling and interference for high speed/critical signal routing without an increase in the substrate area.

Because the metal layers 306, 308 can be formed closer together, several advantages are realized. First, the IC substrate 300 has improved routing density (e.g., more features are provided in an area). This increased density provides greater mechanical stability to the IC substrate 300. Second, the IC substrate 300 has improved electrical performance. For example, there is decreased loop inductance of conductive lines (e.g., metal layers 306, 308) in the substrate 300 because the conductive lines are closer together. When the conductive lines are closer together, the loop through which current travels is made smaller. A larger loop creates a stronger magnetic field, and results in a greater inductance than a smaller loop. In package substrate embodiments, there is reduced package inductance because of thinner package thickness. Moreover, better tolerance/control and reduced coupling distance can be used in designing directional couplers, filter, and inductors without an increase in substrate area.

In exemplary embodiments, the dielectric layer 306 is coated onto the first patterned metal layer 304 in a uniform thickness. For example, the thickness T1 is substantially the same as the thickness T2. With the use of very controlled dielectric processing, such as vacuum coating, the thickness of dielectric layer 306 can be made very uniform. This controlled dielectric processing allows the formation of both thick and fine line metal patterns. For instance, as shown in FIG. 3A, the second patterned metal layer 308 includes a portion having a larger width W1 and a thinner width W2. In other embodiments, the second patterned metal layer 308 includes portions having substantially the same width.

Figure 3B:
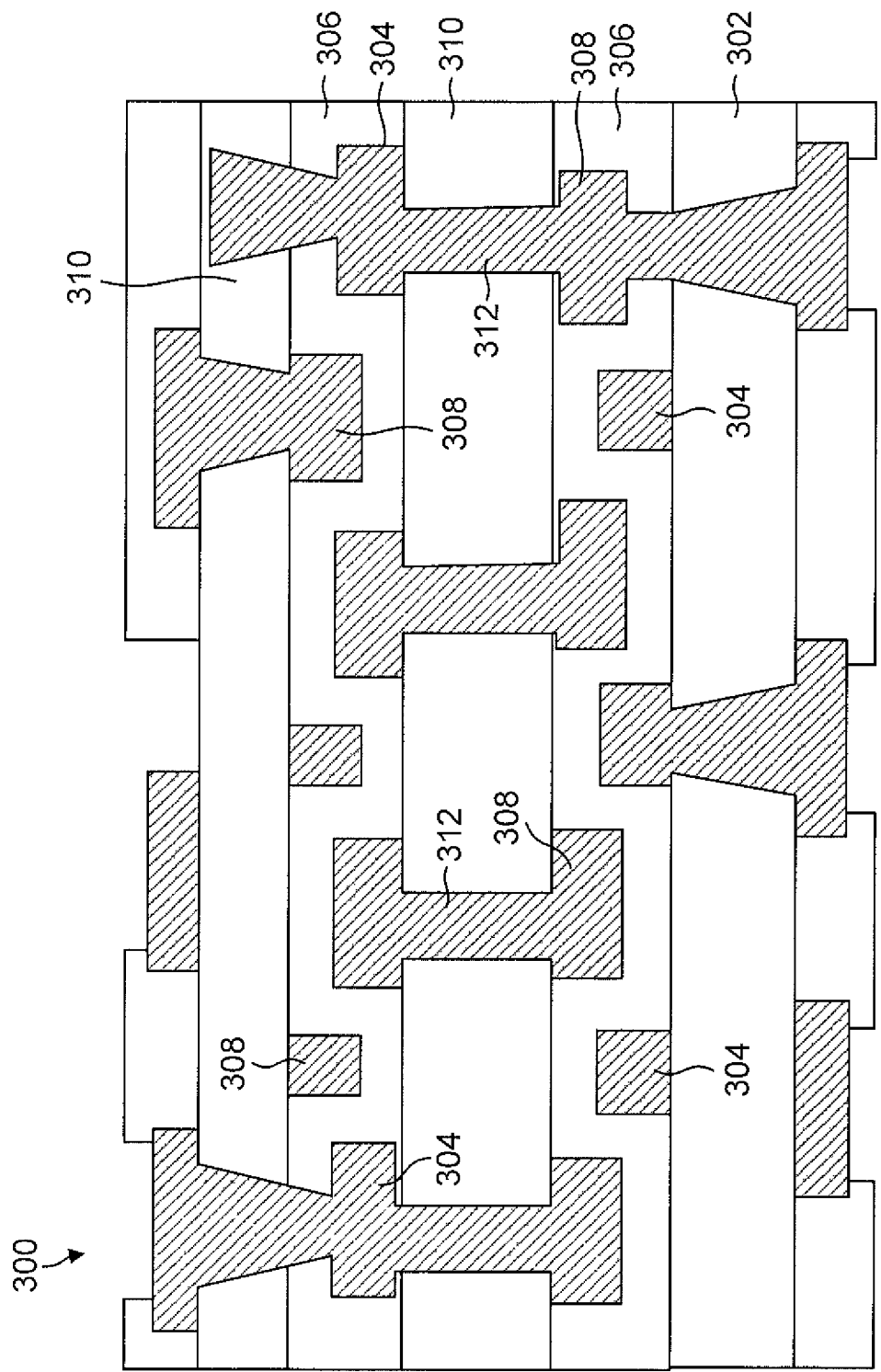
FIG. 3B is a cross-sectional view of an IC substrate with a pattern in between a pattern in accordance with an embodiment of the present disclosure.

FIG. 3B illustrates an IC substrate 300 having a substrate 302 built up with second patterned metal layers 308 formed in between first patterned metal layers 304 to provide a low profile substrate having a reduced thickness or height. The first patterned metal layers 304 are separated from the second patterned metal layers 308 by dielectric layers 306. Non-conductive layers 310 are formed over the second patterned metal layers 308. In various embodiments, the first patterned metal layers 304 are coupled to the second patterned metal layers 308 through vias 312.

In an exemplary embodiment, the thickness of an IC substrate prepared according to traditional implementations is about 656 microns. When the IC substrate is prepared according to the present disclosure with second patterned metal layers formed in between first patterned metal layers, the thickness of the substrate is reduced to about 586 microns. This is a difference in thickness of about 70 microns or about 10.7%.

Package and Die Substrate Embodiments

FIG. 4 illustrates a flip-chip package 400 that includes a substrate in accordance with one or more embodiments of the present disclosure. Package 400 includes a die substrate 410 (e.g., an integrated circuit die) and a package substrate 420 such as an organic package substrate. Die 410 electrically (and mechanically) interconnects with package substrate 420 by means of solder bumps 412 as known in the flip-chip packaging arts. Alternatively bumps 412 may be replaced by copper pillars or other suitable interconnects. More generally, package 400 includes a means for conductively interconnecting die 410 to package substrate 420 such as through the use of bumps 412 (e.g., solder bumps, or copper pillars). Package substrate 420 couples to a printed circuit board 330 via solder balls 422.

In one embodiment, the die substrate 410 includes a substrate with patterned metal layers formed in between other patterned metal layers according to the present disclosure. In another embodiment, the package substrate 420 includes a substrate with patterned metal layers formed in between other patterned metal layers according to the present disclosure. In yet another embodiment, both the die substrate 410 and the package substrate 420 include a substrate with patterned metal layers formed in between other patterned metal layers according to the present disclosure.

Example Methods of Manufacture

FIG. 5A through FIG. 5H illustrate manufacturing steps for forming an IC substrate, such as IC substrate 300 of FIGS. 3A-3B.

In FIG. 5A, the IC substrate starts off with a first patterned metal layer 502 formed on a substrate 500. The first patterned metal layer 502 and the substrate 500 are coated with a dielectric layer 504. The dielectric layer 504 conforms to the shape of the first patterned metal layer 502. In an exemplary embodiment, vacuum coating is used to deposit the dielectric layer 504 on the first patterned metal layer 502 and the substrate 500. Vacuum coating provides precise control of film thickness and for the deposition of uniform films. In various embodiments, vacuum coating is used to deposit thin dielectric films on the first patterned metal layer 502 and the substrate 500. In one embodiment, the thickness of the dielectric layer 504 is about 10 µm.

In FIG. 5B, a metal seed layer 506 is deposited on top of the dielectric layer 504. The metal seed layer 506 may include any suitable metal, such as copper or cobalt. In an embodiment, the metal seed layer 506 is deposited by physical vapor deposition (PVD) or chemical vapor deposition (CVD).

FIG. 5C illustrates the deposition of a photoresist layer 508 over the metal seed layer 506. For example, the photoresist layer 508 can be deposited using spin-on coating methods, CVD, plasma-enhanced chemical vapor deposition (PECVD), low energy chemical vapor deposition (LECVD), evaporation, and the like.

Figure 5D:
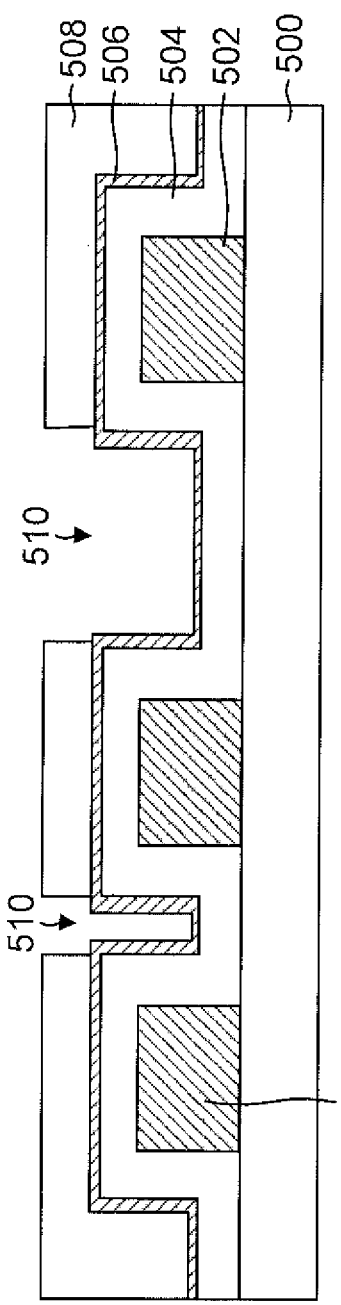

FIG. 5D illustrates the patterning of the photoresist layer 508 to form openings 510 that expose portions of the metal seed layer 506. Any suitable patterning method known in the art may be used to pattern the photoresist layer 508. Typically, patterning involves radiation of a portion of the photoresist layer 508 and development. In one example of the exposure, the photoresist layer 508 is selectively exposed by radiation beam through a mask having a predefined pattern. The radiation beam includes ultraviolet (UV) light in one example. After the exposing process, the photoresist layer 508 is further processed by a thermal baking process, referred to as a post exposure bake (PEB). The PEB may induce a cascade of chemical transformations in the exposed portion of the photoresist layer 508, which is transformed to have an increased or decreased solubility of the photoresist layer 508 in a developer. Thereafter, the photoresist layer 508 is developed such that the exposed resist portion is either: (1) dissolved and washed away or (2) remains during the developing process.

Figure 5E:
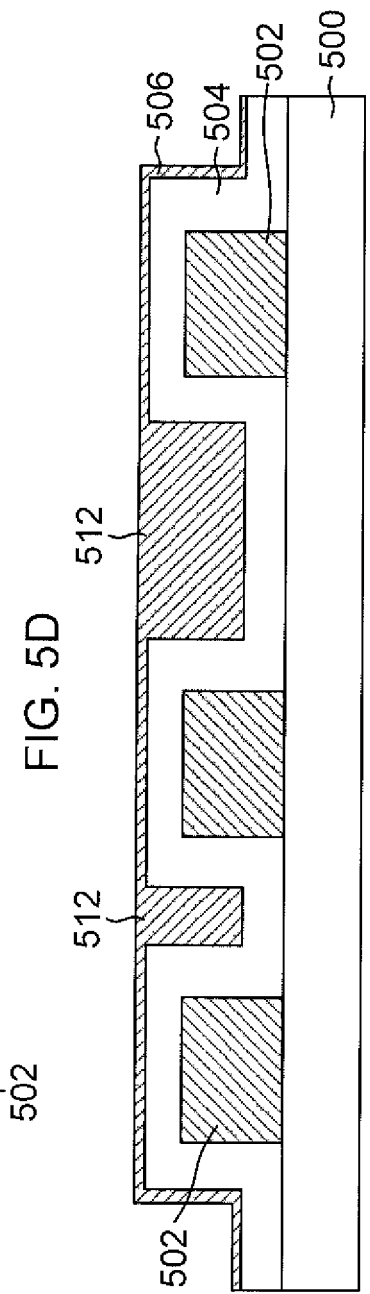

In FIG. 5E, the openings 510 are filled with conductive material 512 and the photoresist layer 508 is removed. According to one embodiment, the conductive material 512 is deposited using conventional electroplating procedures or electrolytic deposition. The conductive material 512 may be, for example, copper or nickel. The photoresist layer 508 may be removed by a process such as wet stripping or $O_2$ plasma ashing.

Figure 5F:
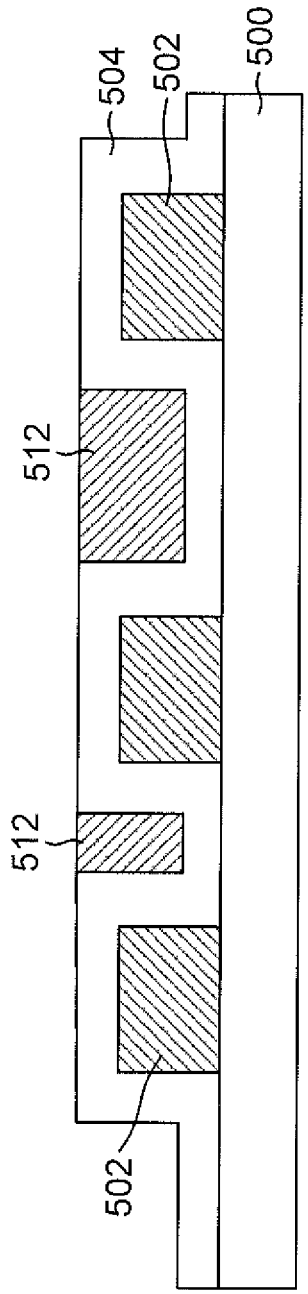

In FIG. 5F, the portions of the metal seed layer 506 that are not covered by conductive material 512 are etched out. The conductive material 512 forms a second patterned metal layer 512 that is between the first patterned metal layer 502. The second patterned metal layer 512 is separated from the first patterned metal layer 502 by the dielectric layer 504. This pattern between pattern feature provides a substrate that has reduced thickness or height.

Figure 5G:
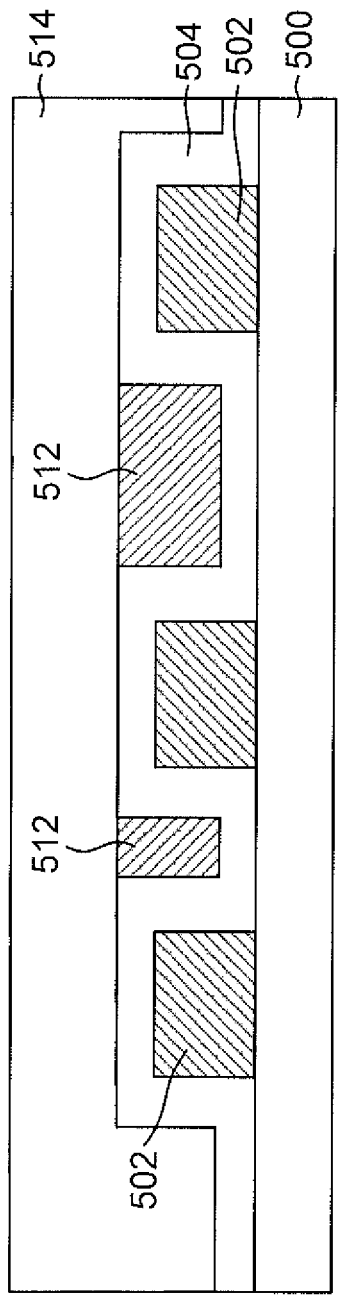
Figure 5H:
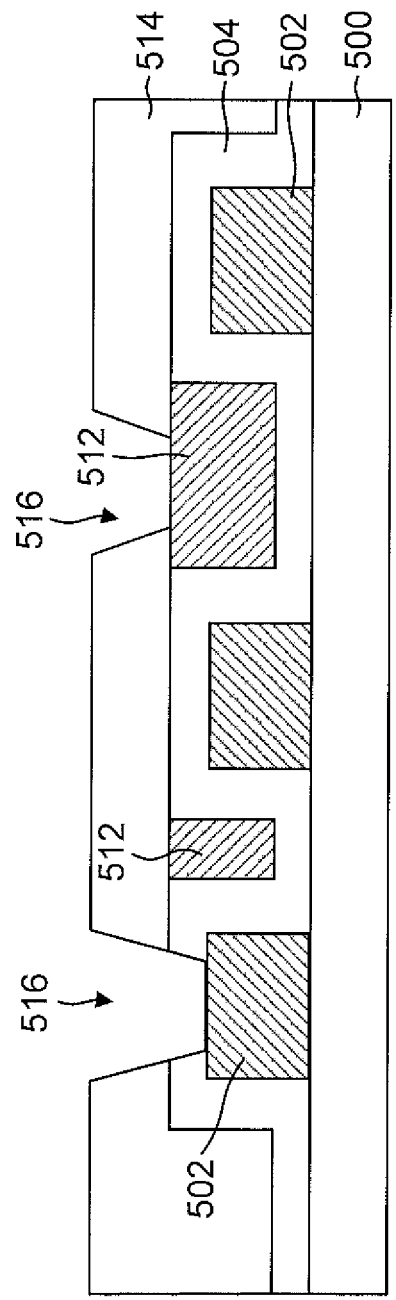

In FIG. 5G, a non-conductive layer (e.g., dielectric or prepreg layer) is formed over the dielectric layer 504 and the second patterned metal layer 512. In FIG. 5H, openings 516 for vias are formed in the non-conductive layer 514 and dielectric layer 504. In an exemplary embodiment, the non-conductive layer 514 and the dielectric layer 504 are etched or laser drilled to form the openings 516 for vias. As can be seen, vias can be formed on both the first patterned metal layer 502 and second patterned metal layer.

Method of Manufacturing Flowchart

Figure 6:
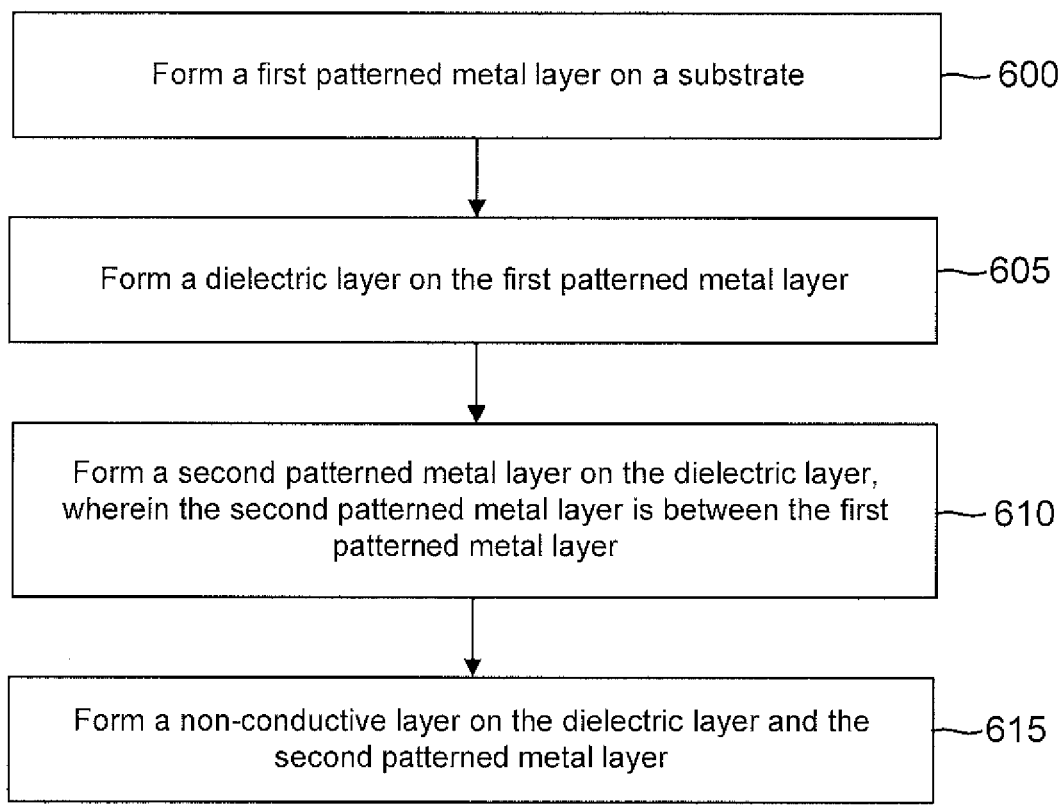
FIG. 6 is a flowchart for a method of manufacture for an IC substrate with a pattern in between a pattern in accordance with an embodiment of the present disclosure.

A manufacturing process generic to the various embodiments discussed herein may be summarized as shown in a flowchart of FIG. 6. A first step 600 comprises forming a first patterned metal layer on a substrate. This step is illustrated, for example, in FIG. 5A. A second step 605 comprises forming a dielectric layer on the first patterned metal layer. An example of this step is shown in FIG. 5A. In various embodiments, the dielectric layer is formed onto the first patterned metal layer using vacuum coating. The dielectric layers formed using vacuum coating may have a uniform thickness. The process includes a step 610 of forming a second patterned metal layer on the dielectric layer. The second patterned metal layer is formed between the first patterned metal layer. This step is illustrated, for example, in FIGS. 5C-5F. Finally, the process includes a step 615 of forming a non-conductive layer on the dielectric layer and the second patterned metal layer. This step is illustrated, for example, in FIG. 5G.

Example Electronic Systems

Figure 7:
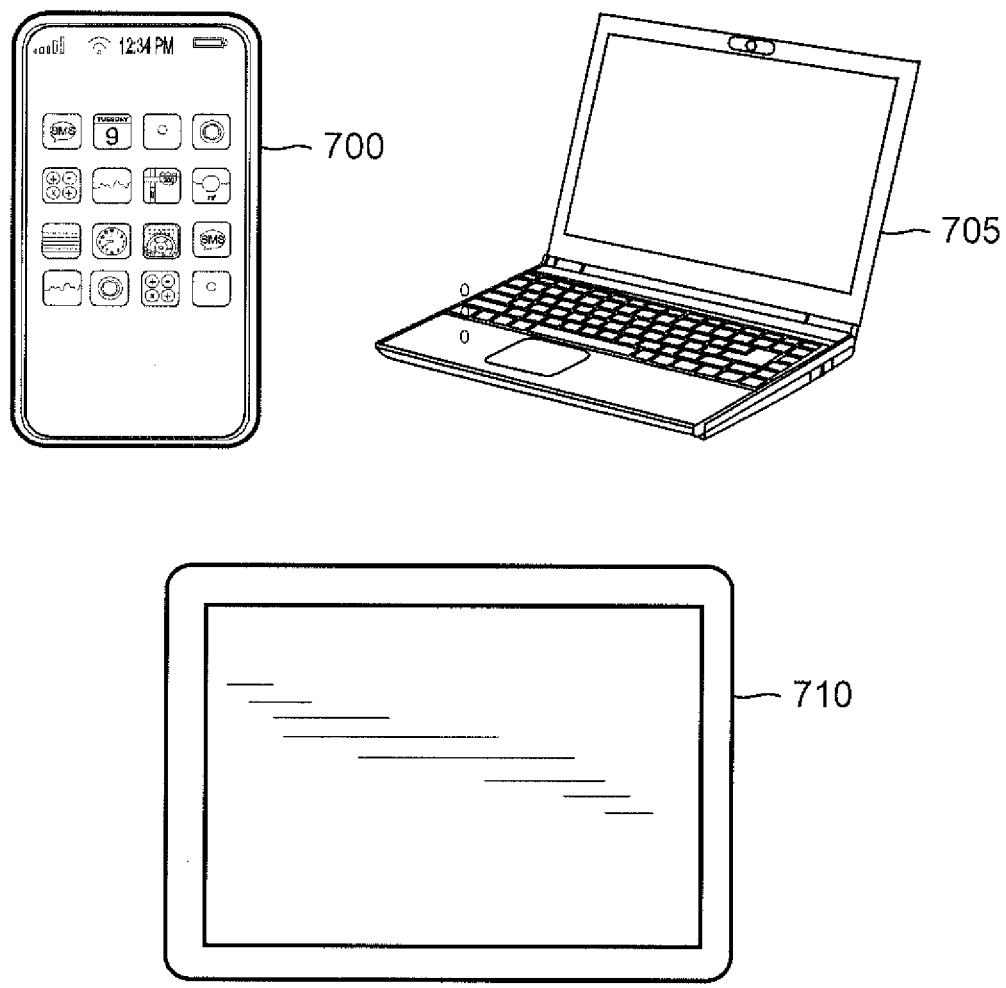
FIG. 7 illustrates some example electronic systems incorporating an IC substrate with a pattern in between a pattern in accordance with an embodiment of the present disclosure.

Integrated circuit packages including an IC substrate as disclosed herein may be incorporated into a wide variety of electronic systems. For example, as shown in FIG. 7, a cell phone 700, a laptop 705, and a tablet PC 710 may all include an integrated circuit package incorporating a substrate constructed in accordance with the disclosure. Other exemplary electronic systems such as a music player, a video player, a communication device, and a personal computer may also be configured with integrated circuit packages constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A substrate, comprising:
 a first patterned metal layer on a substrate;
 a dielectric layer on the first patterned metal layer;
 a second patterned metal layer on the dielectric layer, wherein one or more portions of the second patterned metal layer are located on the dielectric layer in between one or more portions of the first patterned metal layer; and a non-conductive layer on the dielectric layer and the second patterned metal layer.

2. The substrate of claim 1, wherein the dielectric layer conforms to a shape of the first patterned metal layer.

3. The substrate of claim 1, wherein the dielectric layer has a uniform thickness.

4. The substrate of claim 3, wherein the dielectric layer is about 10 µm thick.

5. The substrate of claim 1, wherein the dielectric layer comprises silicon oxide.

6. The substrate of claim 1, wherein the first patterned metal layer and second patterned metal layer comprise copper.

7. The substrate of claim 1, wherein the second patterned metal layer is substantially parallel to the first patterned metal layer.

8. The substrate of claim 1, wherein the second patterned metal layer comprises portions having different widths.

9. The substrate of claim 1, wherein the non-conductive layer comprises a dielectric material, a prepreg material, an organic material, or a combination thereof.

10. The substrate of claim 1, wherein the IC substrate comprises a package substrate.

11. The substrate of claim 1, wherein the substrate is incorporated into at least one of a cellphone, a laptop, a tablet, a music player, a communication device, a computer, or a video player.

12. A substrate comprising:
a first patterned metal layer on a substrate;
a second patterned metal layer, wherein one or more portions of the second patterned metal layer are located in between one or more portions of the first patterned metal layer;
a non-conductive layer on the second patterned metal layer;
a third patterned metal layer on the non-conductive layer; and
a fourth patterned metal layer, wherein one or more portions of the fourth patterned metal layer are located in between one or more portions of the third patterned metal layer.

13. The substrate of claim 12, further comprising a first dielectric layer on the first patterned metal layer and a second dielectric layer on the third patterned metal layer.

14. The substrate of claim 13, wherein the first dielectric layer conforms to a shape of the first patterned metal layer and the second dielectric layer conforms to a shape of the third patterned metal layer.

15. The substrate of claim 13, wherein the first and second dielectric layers have a uniform thickness.

16. The substrate of claim 15, wherein the first and second dielectric layers are about 10 µm thick.

17. The substrate of claim 12, wherein the second patterned metal layer is substantially parallel to the first patterned metal layer and the fourth patterned metal layer is substantially parallel to the third patterned metal layer.

18. The substrate of claim 12, wherein the second patterned metal layer and the fourth metal layer each comprise portions having different widths.

19. The substrate of claim 12, further comprising a plurality of vias that electrically connect the second patterned metal layer to the third patterned metal layer.

20. The substrate of claim 19, wherein the plurality of vias extend through the non-conductive layer.

21. A method comprising:
forming a first patterned metal layer on a substrate;
forming one or more portions of a second patterned metal layer in between one or more portions of the first patterned metal layer; and
forming a non-conductive layer on the second patterned metal layer.

22. The method of claim 21, further comprising forming a dielectric layer on the first patterned metal layer.

23. The method of claim 22, wherein forming the dielectric layer comprises vacuum coating the dielectric layer on the first patterned metal layer.

24. The method of claim 21, wherein forming the second patterned metal layer comprises a photolithography process.

25. The method of claim 21, wherein forming the second patterned metal layer comprises an electroplating process.

26. The method of claim 21, further comprising forming openings in the non-conductive layer.

27. The method of claim 26, wherein forming openings comprises laser drilling the non-conductive layer.

28. A device, comprising:
a first patterned metal layer on a substrate;
a second patterned metal layer, wherein one or more portions of the second patterned metal layer are located in between one or more portions of the first patterned metal layer;
means for separating the first patterned metal layer from the second patterned metal layer; and
a non-conductive layer on the means and the second patterned metal layer.

29. The device of claim 28, wherein the means for separating comprise a dielectric layer on the first patterned metal layer.

30. The device of claim 29, wherein the dielectric layer conforms to a shape of the first patterned metal layer.

* * * * *